United States Patent
Chang et al.

(10) Patent No.: US 7,236,390 B1
(45) Date of Patent: Jun. 26, 2007

(54) BIT CELL OF ORGANIC MEMORY

(75) Inventors: Wei-Jen Chang, Tainan (TW); Shyh-Shyuan Sheu, Taichung (TW); Jan-Ruei Lin, Taipei County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 11/308,146

(22) Filed: Mar. 8, 2006

(30) Foreign Application Priority Data

Dec. 30, 2005 (TW) ............................. 94147726 A (51) Int. Cl.
  *G11C 11/00* (2006.01)
  *G11C 13/00* (2006.01)
(52) U.S. Cl. ................. 365/151; 365/148; 365/163; 257/40
(58) Field of Classification Search ............... 365/151
  See application file for complete search history.

(56) References Cited

U.S. PATENT DOCUMENTS

| | | | | |
|---|---|---|---|---|
| 3,833,894 A * | 9/1974 | Aviram et al. ............ | 365/151 |
| 6,362,509 B1 * | 3/2002 | Hart ........................... | 257/369 |
| 6,903,958 B2 * | 6/2005 | Bernds et al. .............. | 365/96 |
| 6,947,321 B2 * | 9/2005 | Tanabe ....................... | 365/174 |
| 6,950,331 B2 * | 9/2005 | Yang et al. ................. | 365/148 |
| 7,035,140 B2 * | 4/2006 | Jackson et al. ............ | 365/174 |
| 2006/0261331 A1 * | 11/2006 | Yukawa ..................... | 257/40 |
| 2006/0263634 A1 * | 11/2006 | Yamazaki ................. | 428/690 |

* cited by examiner

*Primary Examiner*—Son L. Mai
(74) *Attorney, Agent, or Firm*—Jianq Chyun IP Office (57) ABSTRACT

A bit cell of an organic memory is provided. The bit cell of the organic memory comprises an organic memory cell, a first transistor, a current mirror and a second transistor. To connect the organic memory cell to a data line, the first transistor is activated for reading and the second transistor is activated for writing. Furthermore, the first transistor has a greater size than the second transistor. Therefore, a fast processing time in writing and a large conduction current in reading are catered for. In addition, the current mirror amplifies the conduction current in reading and increases the capacity for resisting the interference by adjacent bit cell.

17 Claims, 6 Drawing Sheets

BIT CELL OF ORGANIC MEMORY

CROSS-REFERENCE TO RELATED APPLICATION

This application claims the priority benefit of Taiwan application serial no. 94147726, filed on Dec. 30, 2005. All disclosure of the Taiwan application is incorporated herein by reference.

BACKGROUND OF THE INVENTION

1. Field of the Invention

The present invention relates to an organic memory fabricated using an organic material. More particularly, the present invention relates to a bit cell in an organic bit cell memory array.

2. Description of the Related Art

In recent years, bistable materials are often used in the fabrication of memory devices, switching devices and so on. The bistable material comprises an inorganic and an organic material. Furthermore, the bistable material can switch between a high and a low resistance state according to the applied voltage. It should be noted that a multi-state memory device could be produced when this type of bistable organic material is disposed between two electrodes and the multi-state memory device has great potential to become the next generation of non-volatile memory.

Compared with a silicon-based device, an organic device fabricated from an organic material has the advantages of a better extensibility and bending capacity. Because the organic material can be coated on virtually any types of surfaces, the idea of forming an organic memory array on a flexible plastic substrate can be realized. Furthermore, the organic material can be fabricated and processed after all the silicon processes have been completed so that the entire processing operation is simplified. Due to the aforementioned advantages and properties, many types of printing manufacturing processes are likely to be developed for mass-producing the organic devices, thereby substantially reducing the production cost of the device and widening its applications.

Figure 1:
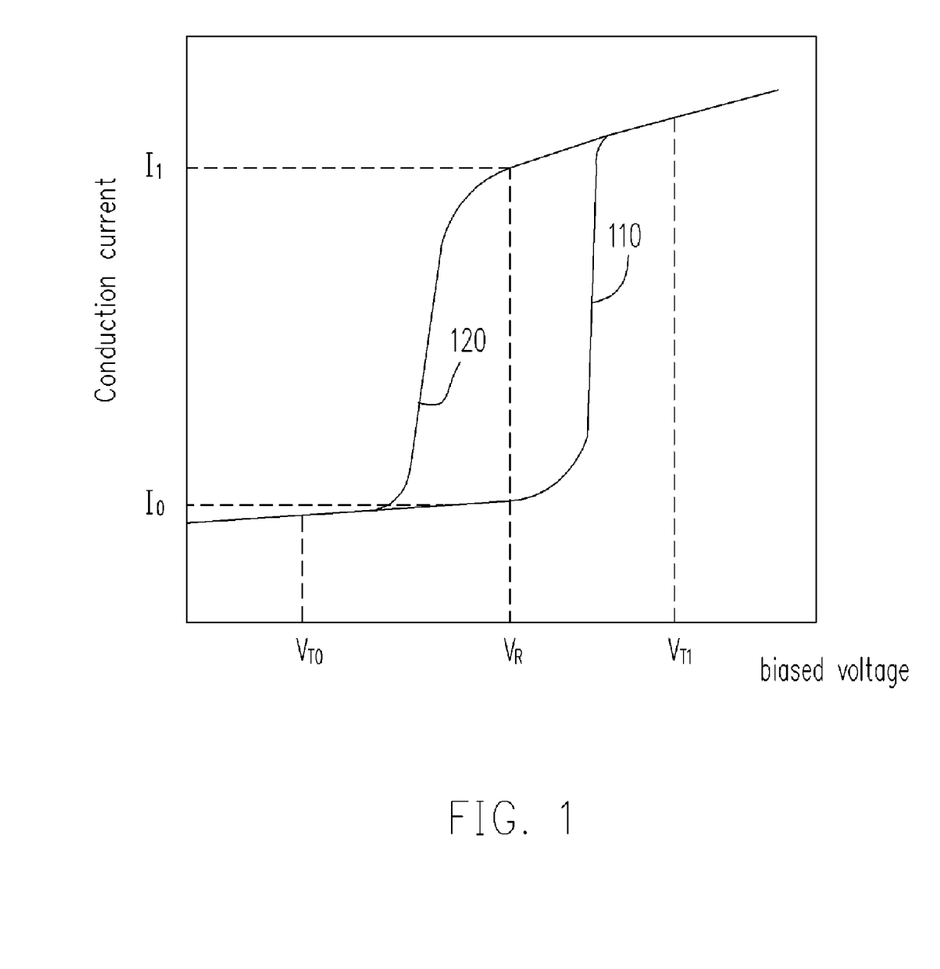
FIG. 1 is a graph showing the ideal operating curve of an organic memory cell inside an organic memory.

FIG. 1 is a graph showing the ideal operating curve of an organic memory cell inside an organic memory. The organic memory cell is fabricated using an organic material. As shown in FIG. 1, the organic memory cell has at least a bistable characteristic. That is, the organic memory cell can station in a high resistance state or a low resistance state. When the organic memory cell is in a high resistance state, the relation between the conduction current and the biased voltage follows the indicated path 110. Thus, if a biased voltage $V_R$ is applied to the organic memory cell when the organic memory cell is in the high resistance state, then the conduction current flowing through the organic memory cell will be $I_0$. When the applied biased voltage exceeds $V_{T1}$, the organic memory cell will change from a high resistance state to a low resistance state. Thereafter, the relation between the biased voltage and the conduction current will follow the path 120. Hence, if the applied biased voltage is $V_R$ when the organic memory cell is in the low resistance state, then the conduction current flowing through the organic memory cell is $I_1$, where $I_1 \gg I_0$. After that, if the applied biased voltage is lower than VT0, then the organic memory cell will revert from a low resistance state back to a high resistance state. It should be noted, however, that the characteristic curve in FIG. 1 is highly idealized. In general, if a different organic material is used in the organic memory cell, the characteristic curve may differ slightly. Yet, all in all, the basic characteristics of the organic memory do not change considerably from the ideal characteristic curve shown in FIG. 1.

Accordingly, a memory fabricated using a bistable organic material can have a greater bending capability such that it can be used in an elastic and bendable system with flexible electronic devices. More specifically, the organic memory has a low production cost so that it can become one of the most important electronic memory devices in the world. Hence, there is an urgent need for developing a practical and complete organic memory. In particular, the development of bit cells for an organic memory with a fast read/write access capability is of the utmost importance.

SUMMARY OF THE INVENTION

Accordingly, at least one objective of the present invention is to provide a bit cell for an organic memory that caters for both the larger conduction current in writing and a faster processing time in reading so that a faster read/write access is achieved. Furthermore, the bit cell has a greater capacity for resisting the interference from adjacent bit cells, finds many practical applications and can be produced en-mass.

To achieve these and other advantages and in accordance with the purpose of the invention, as embodied and broadly described herein, the invention provides a bit cell for an organic memory. The bit cell is connected to a data line, a write select line, and a read select line. The bit cell includes an organic memory cell, a first transistor and a second transistor. Bit data is stored inside the organic memory cell. A first source/drain terminal of the first transistor is connected to the data line, a gate terminal of the first transistor is connected to the write select line, and a second source/drain terminal of the first transistor is connected to the organic memory cell. Furthermore, a first source/drain terminal of the second transistor is connected to the data line, a gate of the second transistor is connected to the read select line, and a second source/drain terminal of the second transistor is connected to the organic memory cell.

According to the embodiment of the present invention, the first transistor in the bit cell of the organic memory has a greater size than the second transistor. When the write select line is activated, the first transistor connects the organic memory cell to the data line so that a bit data is written to the organic memory cell. When the read select line is activated, the second transistor connects the organic memory cell to the data line so that a bit data stored in the organic memory cell is sensed according to the conduction current flowing through the organic memory cell.

From another perspective, the present invention also provide an alternative bit cell for an organic memory. The bit cell is connected to a data line, a write select line, and a read select line. The bit cell includes an organic memory cell, a first transistor, a current mirror and a second transistor. A bit data is stored inside the organic memory cell. A first source/drain terminal of the first transistor is connected to the data line, a gate terminal of the first transistor is connected to the write select line, and a second source/drain terminal is connected to the organic memory cell. The current mirror has a first terminal and a second terminal. The second terminal is connected to the data line. Furthermore, the current flowing through the second terminal is N times the current flowing through the first terminal, where N is greater than or equal to 1. A first source/drain terminal of the second transistor is connected to the first terminal of the current mirror, a gate terminal of the second transistor is connected to the read select line, and a second source/drain terminal of the second transistor is connected to the organic memory cell.

According to one embodiment of the present invention, the current mirror in the bit cell of the organic memory includes a third transistor and a fourth transistor. A first source/drain terminal of the third transistor is connected to a power source, a gate terminal of the third transistor is connected to a second source/drain terminal of the third transistor, the second source/drain terminal of the third transistor is connected to the first terminal of the current mirror. A source/drain terminal of the fourth transistor is also connected to the power source, a gate terminal of the fourth transistor is connected to the gate terminal of the third transistor, and a second source/drain terminal of the fourth transistor is connected to the second terminal of the current mirror.

According to the embodiment of the present invention, the first transistor in the bit cell of the organic memory has a greater size than the second transistor. When the write select line is activated, the first transistor connects the organic memory cell to the data line so that a bit data is written to the organic memory cell. When the read select line is activated, the second transistor connects the organic memory cell to the first terminal of the current mirror so that a bit data stored in the organic memory cell is sensed according to the size of the conduction current flowing through the data line.

From another perspective, the present invention also provide yet another bit cell for an organic memory. The bit cell is connected to a data line, a write select line, and a read select line. The bit cell includes an organic memory cell, a first switching device and a second switching device. A bit data is stored inside the organic memory cell. The first switching device has a first terminal, a second terminal and a control terminal. The first terminal of the first switching device is connected to the data line, the control terminal of the first switching device is connected to the write select line, and the second terminal of the first switching device is connected to the organic memory cell. Furthermore, the second switching device also has a first terminal, a second terminal and a control terminal. The first terminal of the second switching device is connected to the data line, the control terminal of the second switching device is connected to the read select line, and the second terminal of the second switching device is connected to the organic memory cell. When the write select line is activated, the first switching device connects the organic memory cell to the data line so that a data bit is written to the organic memory cell. When the read select line is activated, the second switching device connects the organic memory cell to the data line to detect the bit data stored in the organic memory cell.

According to one embodiment of the present invention, the bit data in the organic memory cell is determined according to the conduction current flowing through the organic memory cell. Furthermore, to increase the strength of the signal in reading, the foregoing bit cell in the organic memory may further include a current mirror disposed between the second switching device and the data line. The current mirror has a first terminal and a second terminal. The first terminal of the current mirror is connected to the first terminal of the second switching device and the second terminal of the current mirror is connected to the data line. Furthermore, the current flowing through the second terminal is N times the current flowing through the first terminal, where N is greater than or equal to 1.

According to one embodiment of the present invention, the organic memory cell of the three aforementioned perspectives of the bit cells in the organic memory includes two electrodes and an organic material mixed layer disposed between the two electrodes.

It should be noted the bit cell of the organic memory provided by the present invention could be combined to form a non-volatile memory.

In brief, the present invention provides a bit cell of an organic memory having at least a first transistor for activating a write operation and a second transistor for activating a read operation. Furthermore, the first transistor has a greater size than the second transistor. Therefore, the bit cell can cater for both the larger conductive current occurring in a write operation and the fast processing speed needed in a read operation. Additionally, a current mirror can be introduced to amplify the conductive current in a read operation and increase the resistance to the inference coming from adjacent bit cells. As a result, the bit cells can be combined en-mass to produce memory devices having many practical applications.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

Figure 2:
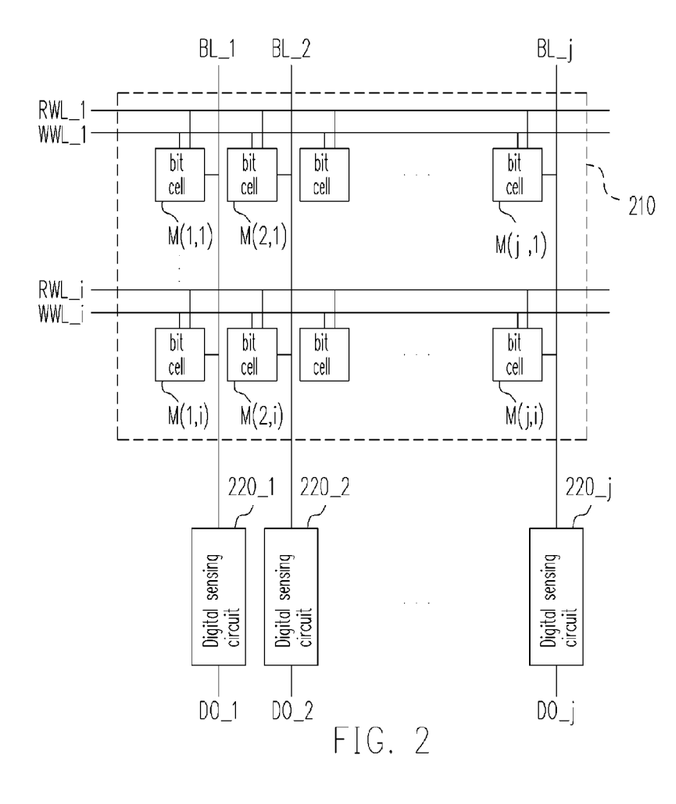
FIG. 2 is block diagram showing the circuit layout of an organic memory according to one embodiment of the present invention.

FIG. 2 is block diagram showing the circuit layout of an organic memory according to one embodiment of the present invention. As show in FIG. 2, the organic memory cell in the present invention includes: i write select lines WWL_1, . . . , WWL_i, i read select lines RWL_1, . . . , RWL_i, j data lines BL_1, . . . , BL_j, a bit cell array 210, and j digital sensing circuits 220_1, 220_2, . . . , 220_j. The bit cell array 210 includes a plurality of bit cells M(1,1), M(2,1), ..., M(j,1), ..., M(1,i), M(2,1), ..., M(j,i). To simplify the explanation, each group of write select line WWL_n and read select line RWL_n is called the $n^{th}$ pair of select line. As shown in FIG. 2, each data line and pair of select lines is at least connect to one of the bit cells, and the digital sensing circuits 220_1, 220_2, ..., 220_j are connected to the corresponding data lines BL_1, BL_2, ..., BL_j. Similarly, to simplify the illustration, the bit cell row B(n) is defined as all the bit cells M(1,n), M(2,n), ..., M(j,n) that connect to the $n^{th}$ pair of select lines, and the bit cell M(m,n) is defined as the bit cell connected to the $m^{th}$ data line and the $n^{th}$ select line. In the aforementioned description, i, j, m, n are positive integer (natural number) greater than 0 such that n<=i, m<=j.

Figure 3:
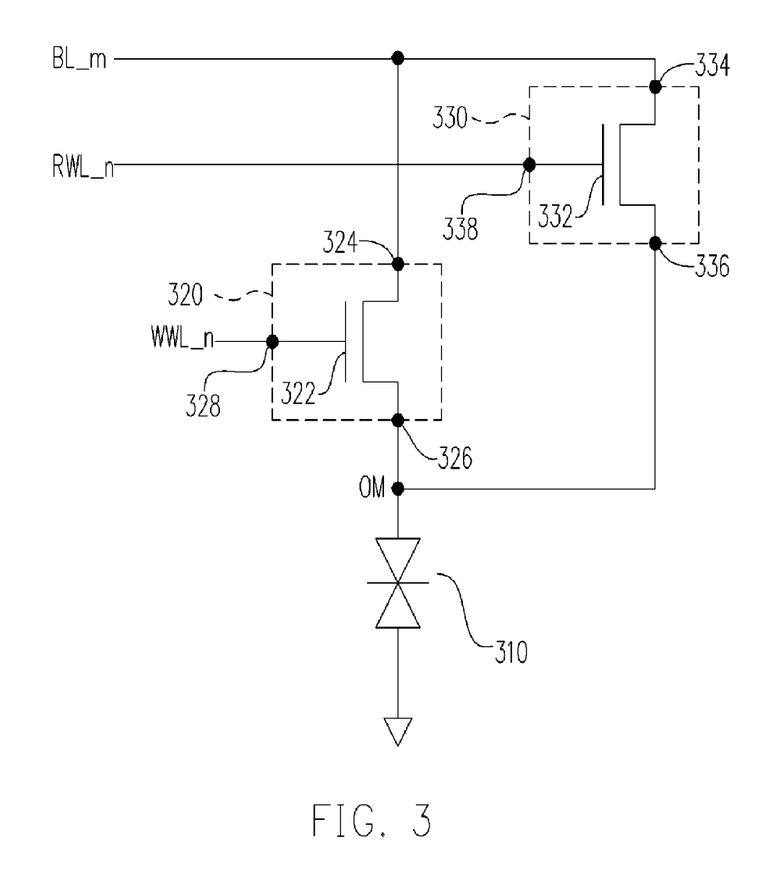
FIG. 3 is a circuit diagram of a bit cell in an organic memory according to one embodiment of the present invention.

FIG. 3 is a circuit diagram of a bit cell in an organic memory according to one embodiment of the present invention. The circuit of a typical bit cell M(m,n) in an organic memory is shown in FIG. 3. The bit cell M(m,n) is connected to the data line BL_m, the write select line WWL_n and the read select line RWL_n. Furthermore, the bit cell M(m,n) includes an organic memory cell 310, a first switching device 320 and a second switching device 330. The organic memory cell 310 is a multi-stable memory device fabricated by disposing an organic material between two electrodes, for example. In other words, the organic memory cell in this example has at least two electrodes and an organic material mixed layer disposed between the electrodes. Thus, the organic memory cell 310 can be used to store bit data. Obviously, one organic memory cell is not limited to the storage of a single bit of data.

As shown in FIG. 3, the first switching device 320 has a first terminal 324, a second terminal 326 and a control terminal 328. The first terminal 324 of the first switching device 320 is connected to the data line BL_m, the control terminal 328 of the first switching device 320 is connected to the write select line WWL_n, and the second terminal 326 of the first switching device 320 is connected to the organic memory cell 310. Furthermore, the second switching device 330 also has a first terminal 334, a second terminal 336 and a control terminal 338. The first terminal 334 of the second switching device 330 is connected to the data line BL_m, the control terminal 338 of the second switching device 330 is coupled to the read select line RWL_n, and the second terminal 336 of the second switching device 330 is connected to the organic memory cell 310. When the write select line WWL_n is activated, the first switching device 320 connects the organic memory cell 310 to the data line BL_m so that a bit data is written to the organic memory cell 310. When the read select line RWL_n is activated, the second switching device 330 connects the organic memory cell 310 to the data line BL_m so that the bit data stored inside the organic memory cell 310 is sensed.

In the present embodiment, the first switching device 320 and the second switching device 330 are the first transistor 332 and the second transistor 332 respectively. Hence, the first source/drain terminal of the first transistor 322 is connected to the data line BL_m, the gate terminal of the first transistor 322 is connected to the write select line WWL_n, and the second source/drain terminal of the first transistor 322 is connected to the organic memory cell 310. Similarly, the first source/drain terminal of the second transistor 332 is also connected to the data line BL_m, the gate terminal of the second transistor 332 is connected to the read select line RWL_n, and the second source/drain terminal of the second transistor 332 is connected to the organic memory cell 310. The first and the second transistor 322, 332 in the present embodiment are N-type transistors. However there is no particular limitation in the present invention. In fact, all kinds of metal-oxide-semiconductor (MOS) transistors can be used. Obviously, the first and the second transistor 322 and 332 can also be P-type transistors or one P-type transistor and one N-type transistor, for example.

Preferably, in the present embodiment, the first transistor in the bit cell of the organic memory has a greater size than the second transistor 332. When the write select line WWL_n is activated, the first transistor 322 connects the organic memory cell to the data line BL_m to write a bit data into the organic memory cell 310. Because the first transistor 322 has a larger size, a larger conduction current can be passed in the writing operation so that the time required to change the state of the organic memory cell 310 is reduced. When the read select line RWL_n is activated, the second transistor 332 connects the organic memory cell 310 to the data line so that the bit data stored in the organic memory cell 310 is sensed according to the conduction current passing the organic memory cell 310. Because the second transistor has a smaller size, the parasitic capacitance of the second transistor 332 is also smaller so that the gate loading is reduced and the processing time required to read out the data is shortened.

As shown in FIGS. 2 and 3, when the read select line RWL_n is activated, the second switching device 330 inside the bit cell row B(n) will connect all the organic memory cells 310 within the bit cell row B(n) to corresponding data lines. These digital sensing circuits 220_1, 220_2, ..., 220_j sense and read out the bit data stored within various organic memory cells 310 within the bit cell row B(n) through the respective data lines BL_1, BL_2, ..., BL_j.

Figure 4:
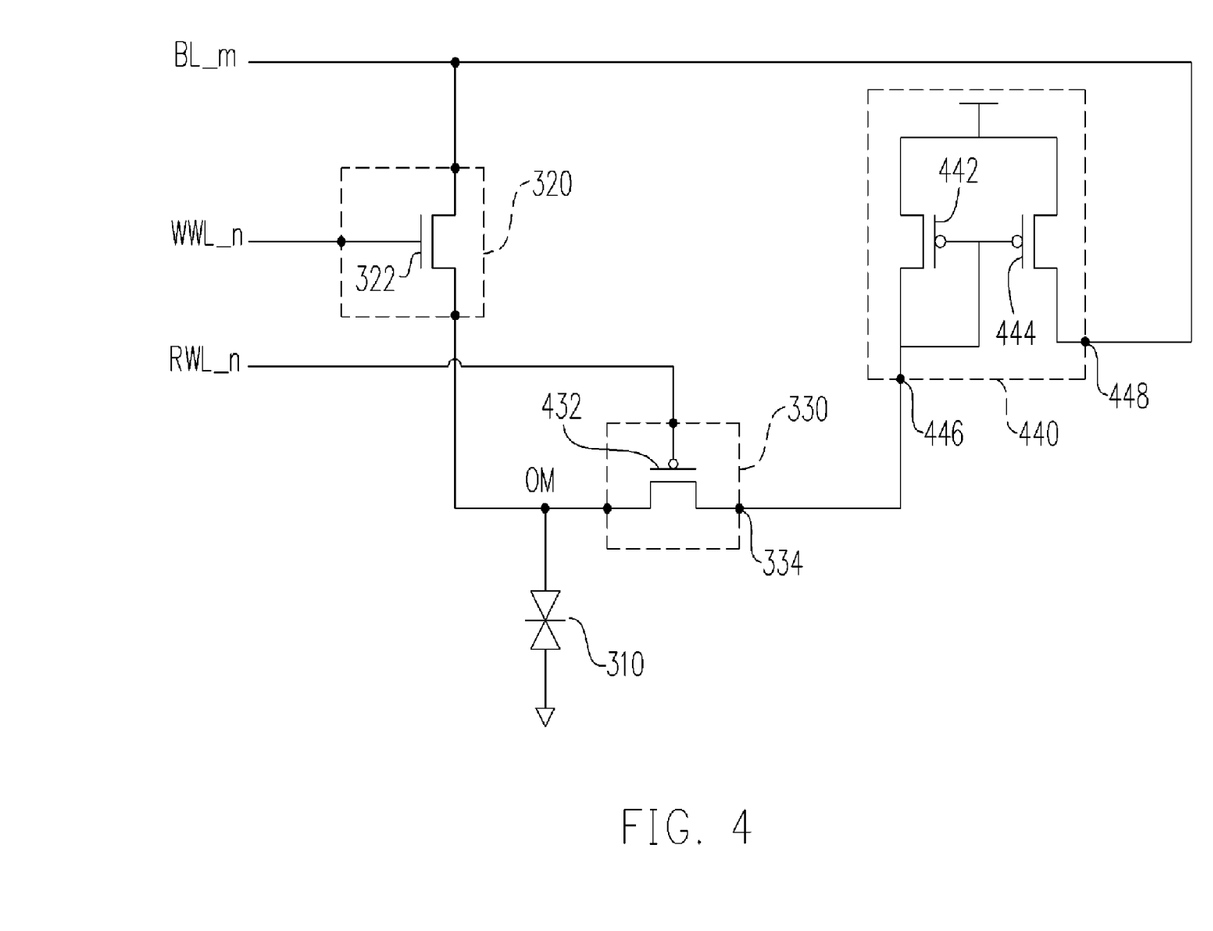
FIG. 4 is a circuit diagram of a bit cell in an organic memory according to another embodiment of the present invention.

FIG. 4 is a circuit diagram of a bit cell in an organic memory according to another embodiment of the present invention. In fact, a bit cell M(m,n) of an organic memory is shown in FIG. 4. The bit cell M(m,n) is connected to the data line BL_m, the write select line WWL_n and the read select line RWL_n. Furthermore, the bit cell M(m,n) includes an organic memory cell 310, a first switching device 320, a current mirror 440 and a second switching device 330. Since the organic memory cell 310, the first switching device 320, the first transistor 32 and the second switching device 330 in FIG. 4 are identical to the ones in FIG. 3, a detailed description of them is omitted. The main difference is that the second transistor 432 serving as the second switching device 330 in the present embodiment is a P-type transistor. Furthermore, a current mirror 440 is installed between the second switching device 330 and the data line BL_m. The current mirror 440 has a first terminal 446 and a second terminal 448. The first terminal 446 of the current mirror 440 is connected to the first terminal 334 of the second switching device 330, and the second terminal 448 of the current mirror 440 is connected to the data line BL_m. In other words, the first source/drain terminal of the second transistor 432 is connected to the first terminal 446 of the current mirror 440, the gate terminal of the second transistor 432 is connected to the read select line RWL_n, and the second source/drain terminal of the second transistor 432 is connected to the organic memory cell 310. The current mirror 440 mainly serves to amplify the conduction current flowing through the organic memory cell 310 in a reading operation so that the reading current passing through the data line BL_m is N times the conduction current. Hence, the reading signal is strengthened and its capacity for resisting interference from adjacent bit cells is increased. As a result, the current through the second terminal 448 is N times the current through the first terminal 446. Here, N is greater than or equal to 1.

As shown in FIG. 4, the current mirror 440 includes a third transistor 442 and a fourth transistor 444. A first source/drain terminal of the third transistor 442 is connected to a power source, a gate terminal of the third transistor 442 is connected to a second source/drain terminal of the third transistor 442, and the second source/drain terminal of the third transistor 442 is connected to the firs terminal 446 of the current mirror 440. Similarly, a first source/drain terminal of the fourth transistor 444 is connected to the power source, a gate terminal of the fourth transistor 444 is connected to the gate terminal of the third transistor 442, and a second source/drain terminal of the fourth transistor 444 is connected to the second terminal 448 of the current mirror 440. Due to factors such as the layout dimension and design of the third transistor 442 and the fourth transistor 444, the current through the second source/drain terminal of the fourth transistor 444 is N times the current through the second source/drain terminal of the third transistor 442. When the read select line RWL_n is activated, the second transistor 432 connects the organic memory cell 310 to the first terminal 446 of the current mirror 440 so that the size of the reading current in the data line BL_m can be used to detect the bit data stored in the organic memory cell 310.

Figure 5:
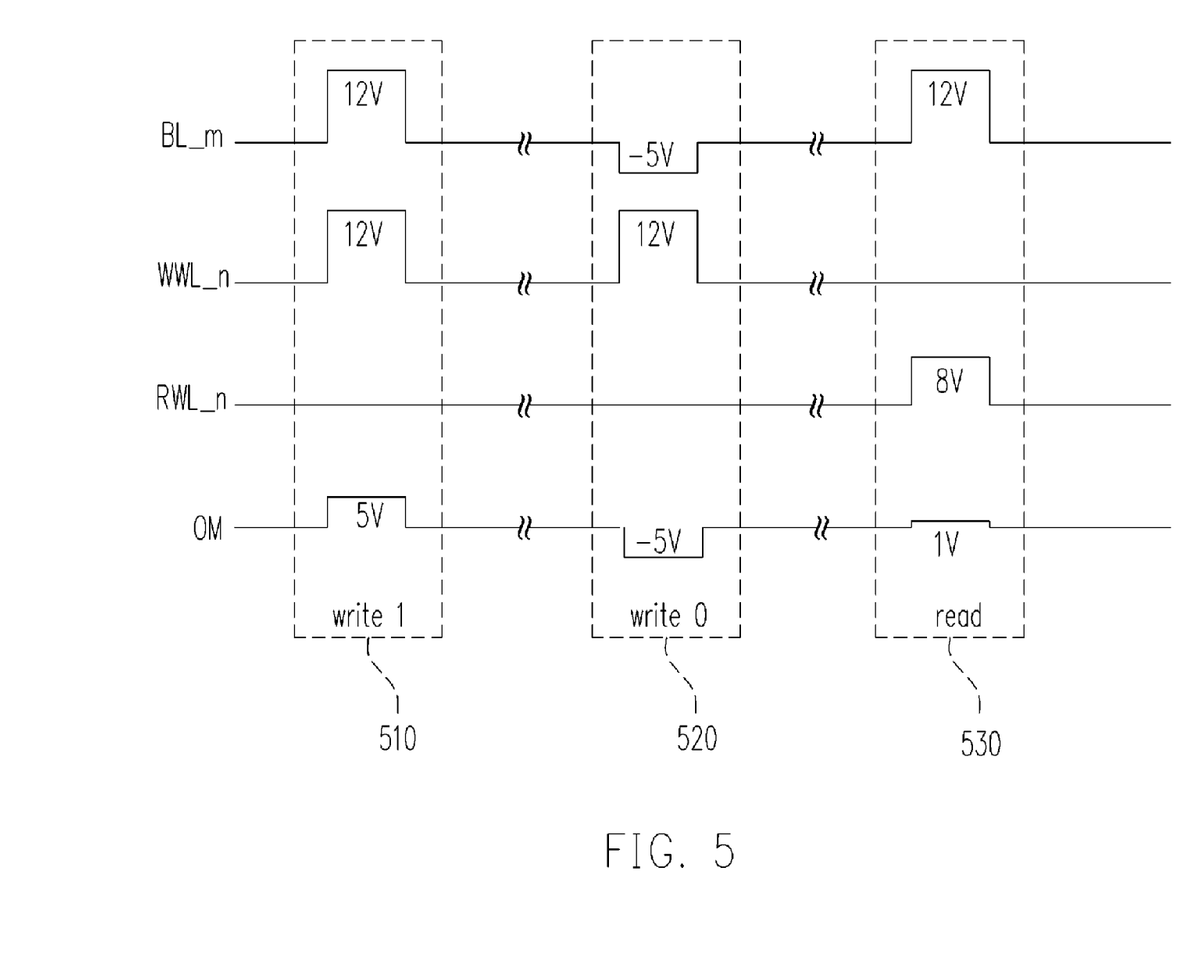
FIG. 5 is a time sequence diagram of the signals when the bit cell of the organic memory in FIG. 3 is in operation.

FIG. 5 is a time sequence diagram of the signals when the bit cell of the organic memory in FIG. 3 is in operation. As shown in FIG. 5, the labels 510, 520 and 530 represent the timing states for writing a 1, writing a 0 and reading a data bit respectively. To write a '1' into the bit cell, a high potential, for example 12V, is applied to the data line BL_m, and a high potential, for example 12V, is applied to activate the write select line WWL_n while the read select line RWL_n remains deactivated so that the voltage at the OM node in the organic memory cell exceeds the voltage, for example 5V, needed for changing to a low resistance state. To write a '0' into the bit cell, a negative voltage, for example −5V, is applied to the data line BL_m, and a high potential, for example 12V, is applied to activate the write select line WWL_n while the read select line RWL_n remains deactivated so that the voltage at the OM node of the organic memory cell falls below the voltage, for example −5V, needed for changing to a high resistance state. To read data from the bit cell, a high potential, for example 12V, is applied to the data line BL_m, and a high potential, for example 8V, is applied to activate the read select line RWL_n while the write select line WWL_n remains deactivated so that the voltage at the OM node of the organic memory cell is maintained at a middle potential, for example 1V, for judging the size of the conduction current flowing through the organic memory cell.

Figure 6:
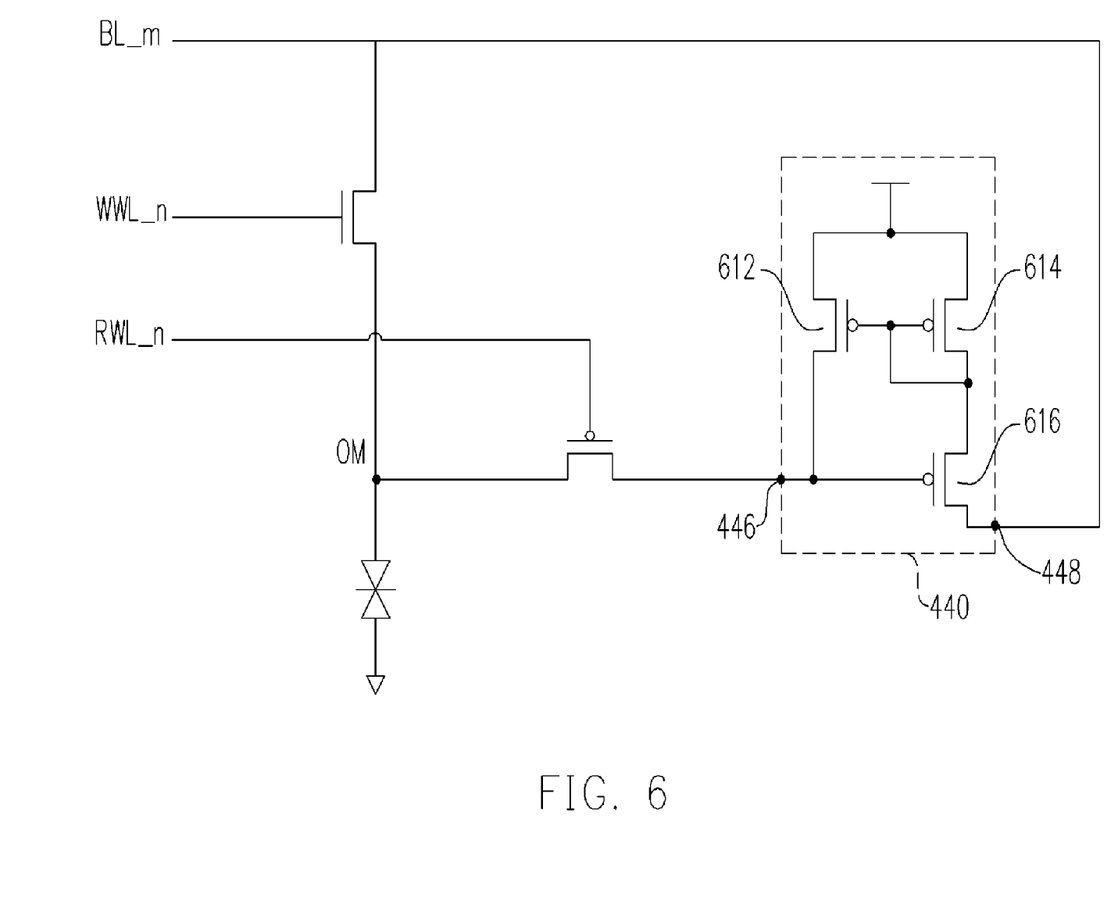
FIG. 6 is a circuit diagram of a bit cell in an organic memory according to another embodiment of the present invention.

FIG. 6 is a circuit diagram of a bit cell in an organic memory according to another embodiment of the present invention. As shown in FIG. 6, all components except the circuit inside the current mirror 440 are identical to the ones in FIG. 4. Hence, a detailed description is not repeated here. Similarly, the current mirror 440 has a first terminal 446 and a second terminal 448. Furthermore, the current through the second terminal 448 is N times the current through the first terminal 446, where N is a number greater than or equal to 1. The only difference from the current mirror in FIG. 4 is that the current mirror 440 in FIG. 6 has a Wilson current mirror structure comprising three transistors 612, 614 and 616. The advantage of the structure is its capacity for increasing the output impedance so that the output replicate current will not become inaccurate as a result of the voltage variation between the source and the drain of the transistor.

It should be noted that the organic material will not change its state at the disappearance of the bias voltage. Therefore, the bit cell of the organic memory according to the present invention can be grouped together to produce a non-volatile memory.

From another point of view, the application of the circuit structure of the bit cell is not limited to an organic memory in the present invention. For example, other types of memory structure such as the phase change memory (PCM) or magnetic random access memory (MRAM) can also use an identical circuit structure in the aforementioned embodiments as long as the organic memory cell is switched to correspondingly different types of memory cells.

In summary, the present invention provides a bit cell of an organic memory having at least a first transistor for activating a write operation and a second transistor for activating a read operation. Furthermore, the first transistor has a greater size than the second transistor. Therefore, the bit cell can cater for both the larger conductive current occurring in a write operation and the fast processing speed needed in a read operation. Additionally, a current mirror can be introduced to amplify the conductive current in a read operation and increase the resistance to the inference coming from adjacent bit cells. As a result, the bit cells can be combined en-mass to produce memory devices having many practical applications.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bit cell for an organic memory, wherein the bit cell is connected to a data line, a write select line and a read select line, the bit cell comprising:
   an organic memory cell for storing at least a bit data;
   a first transistor, wherein a first source/drain terminal of the first transistor is connected to the data line, a gate of the first transistor is connected to the write select line, and a second source/drain terminal of the first transistor is connected to the organic memory cell; and
   a second transistor, wherein a first source/drain terminal of the second transistor is connected to the data line, a gate terminal of the second transistor is connected to the read select line, and a second source/drain terminal of the second transistor is connected to the organic memory cell.

2. The bit cell of claim 1, wherein the first transistor has a greater size than the second transistor.

3. The bit cell of claim 1, wherein after activating the write select line, the first transistor connects the organic memory cell to the data line for writing the bit data to the organic memory cell, and after activating the read select line is activated, the second transistor connects the organic memory cell to the data line for sensing the bit data stored in the organic memory cell.

4. The bit cell of claim 3, wherein the bit data in the organic memory cell is determined according to size of the conduction current through the organic memory cell.

5. The bit cell of claim 1, wherein the organic memory cell includes two electrodes and an organic material mixed layer disposed between the electrodes.

6. The bit cell of claim 1, wherein the organic memory is a non-volatile memory.

7. A bit cell for an organic memory, wherein the bit cell is connected to a data line, a write select line and a read select line, the bit cell comprising:

an organic memory cell for storing at least a bit data;
a first transistor, wherein a first source/drain terminal of the first transistor is connected to the data line, a gate terminal of the first transistor is connected to the write select line, and a second source/drain terminal of the first transistor is connected to the organic memory cell;
a current mirror having a first terminal and a second terminal, wherein the second terminal is connected to the data line, and the current through the second terminal is N times the current through the first terminal, where N is greater than or equal to 1; and
a second transistor, wherein a first source/drain terminal of the second transistor is connected to the first terminal of the current mirror, a gate of the second transistor is connected to the read select line, and a second source/drain of the second transistor is connected to the organic memory cell.

8. The bit cell of claim 7, wherein the first transistor has a greater size than the second transistor.

9. The bit cell of claim 7, wherein the current mirror includes:
a third transistor, wherein a first source/drain terminal of the third transistor is connected to a power source, a gate terminal of the third transistor is connected to a second source/drain terminal of the third transistor, and the second source/drain terminal of the third transistor is connected to the first terminal of the current mirror; and
a fourth transistor, wherein a source/drain terminal of the fourth transistor is connected to the power source, a gate terminal of the fourth transistor is connected to the gate of the third transistor, and a second source/drain terminal of the fourth transistor is connected to the second terminal of the current mirror.

10. The bit cell of claim 7, wherein after activating the write select line, the first transistor connects the organic memory cell to the data line for writing the bit data to the organic memory cell, and after activating the read select line, the second transistor connects the organic memory cell to the first terminal of the current mirror for sensing the bit data stored in the organic memory cell according to the size of the current flowing in the data line.

11. The bit cell of claim 7, wherein the organic memory cell includes two electrodes and an organic material mixed layer disposed between the electrodes.

12. The bit cell of claim 7, wherein the organic memory is a non-volatile memory.

13. A bit cell for an organic memory, wherein the bit cell is connected to a data line, a write select line and a read select line, the bit cell comprising:
an organic memory cell for storing at least a bit data;
a first switching device having a first terminal, a second terminal and a control terminal, wherein the first terminal of the first switching device is connected to the data line, the control terminal of the first switching device is connected to the write select line, and the second terminal of the first switching device is connected to the organic memory cell; and
a second switching device having a first terminal, a second terminal and a control terminal, wherein the first terminal of the second switching device is connected to the data line, the control terminal of the second switching device is connected to the read select line, and the second terminal of the second switching device is connected to the organic memory cell,
wherein after activating the write select line, the first switching device connects the organic memory cell to the data line for writing the bit data to the organic memory cell, and after activating the read select line, the second switching device connects the organic memory cell to the data line for sensing the bit data stored in the organic memory cell.

14. The bit cell of claim 13, wherein the bit data stored in the organic memory cell is determined according to a conduction current flowing through the organic memory cell.

15. The bit cell of claim 13, wherein the bit cell further includes a current mirror disposed between the second switching device and the data line, and the current mirror has a first terminal and a second terminal such that the first terminal is connected to the first terminal of the second switching device, the second terminal is connected to the data line, and furthermore, the current through the second terminal is N times the current through the first terminal, where N is a greater than or equal to 1.

16. The bit cell of claim 13, wherein the organic memory cell includes two electrodes and an organic material mixed layer disposed between the electrodes.

17. The bit cell of claim 13, wherein the organic memory is a non-volatile memory.

* * * * *